US010566283B2

(12) United States Patent
Sciarrillo et al.

(10) Patent No.: US 10,566,283 B2
(45) Date of Patent: Feb. 18, 2020

(54) SEMICONDUCTOR DEVICE AND A CORRESPONDING METHOD OF MANUFACTURING SEMICONDUCTOR DEVICES

(71) Applicant: STMICROELECTRONICS S.R.L., Agrate Brianza (IT)

(72) Inventors: Samuele Sciarrillo, Usmate Velate (IT); Paolo Colpani, Agrate Brianza (IT); Ivan Venegoni, Bareggio (IT)

(73) Assignee: STMICROELECTRONICS S.R.L., Agrate Brianza (IT)

( * ) Notice: Subject to any disclaimer, the term of this patent is extended or adjusted under 35 U.S.C. 154(b) by 0 days.

(21) Appl. No.: 16/048,108

(22) Filed: Jul. 27, 2018

(65) Prior Publication Data
US 2019/0035740 A1    Jan. 31, 2019

(30) Foreign Application Priority Data
Jul. 28, 2017    (IT) .......................... 102017000087201

(51) Int. Cl.
*H01L 23/528*    (2006.01)
*H01L 23/532*    (2006.01)
(Continued)

(52) U.S. Cl.
CPC .. *H01L 23/53238* (2013.01); *H01L 21/76852* (2013.01); *H01L 23/3171* (2013.01);
(Continued)

(58) Field of Classification Search
CPC ............. H01L 23/3171; H01L 23/5226; H01L 23/5227; H01L 23/5228; H01L 23/528;
(Continued)

(56) References Cited

U.S. PATENT DOCUMENTS 5,223,454 A    6/1993 Uda et al.
5,652,157 A *  7/1997 Hirano ................ H01L 23/5283
                                                257/E21.173
(Continued)

FOREIGN PATENT DOCUMENTS

JP    2013165099 A    8/2013
WO       9852224 A1    11/1998

OTHER PUBLICATIONS

Jul. 27, 2018, A Semiconductor Device and a Corresponding Method of Manufacturing Semiconductor Devices.
(Continued)

*Primary Examiner* — Cuong Q Nguyen
(74) *Attorney, Agent, or Firm* — Seed Intellectual Property Law Group LLP

(57) ABSTRACT

A semiconductor device includes a passivation layer, an interconnection metallization 37 having a peripheral portion over the passivation layer, and an outer surface coating 37 on the interconnection metallization. A diffusion barrier layer comprises an inner planar portion directly on the surface of the passivation layer and a peripheral portion extending along a plane at a vertical height higher than the surface of the passivation layer, so that the peripheral portion forms with the inner portion a step in the barrier layer. The outer surface coating, has a vertical wall with a foot adjacent to the peripheral portion and positioned at the vertical height over the surface of the passivation layer to form a hollow recess area between the surface of the passivation layer and both of the peripheral portion and the foot of the outer surface coating.

21 Claims, 12 Drawing Sheets

(51) Int. Cl.
*H01L 21/768* (2006.01)
*H01L 23/31* (2006.01)
*H01L 23/00* (2006.01)
*H01L 23/525* (2006.01)

(52) U.S. Cl.
CPC .......... *H01L 23/5283* (2013.01); *H01L 24/02* (2013.01); *H01L 23/525* (2013.01); *H01L 2224/0235* (2013.01); *H01L 2224/0239* (2013.01); *H01L 2224/02311* (2013.01); *H01L 2224/02331* (2013.01); *H01L 2224/05147* (2013.01); *H01L 2224/05155* (2013.01); *H01L 2924/01014* (2013.01); *H01L 2924/14* (2013.01)

(58) Field of Classification Search
CPC .......... H01L 23/5283; H01L 23/53238; H01L 23/5329; H01L 23/481
See application file for complete search history.

(56) References Cited

U.S. PATENT DOCUMENTS

| | | | |
|---|---|---|---|
| 6,228,759 B1 | 5/2001 | Wang et al. | |
| 6,521,970 B1 | 2/2003 | Takiar et al. | |
| 6,528,412 B1 | 3/2003 | Wang et al. | |
| 8,298,930 B2 | 10/2012 | Arvin et al. | |
| 8,476,762 B2 | 7/2013 | Daubenspeck et al. | |
| 8,809,951 B2 | 8/2014 | Lin et al. | |
| 8,884,418 B2 | 11/2014 | Camacho et al. | |
| 9,224,686 B1 | 12/2015 | Chen et al. | |
| 2005/0116340 A1 | 6/2005 | Shindo | |
| 2005/0215045 A1 | 9/2005 | Rinne et al. | |
| 2007/0023919 A1 | 2/2007 | Lin et al. | |
| 2007/0290343 A1 | 12/2007 | Harada et al. | |
| 2009/0102032 A1 | 4/2009 | Schneegans et al. | |
| 2010/0109159 A1 | 5/2010 | Ho et al. | |
| 2010/0171219 A1 | 7/2010 | Moreau et al. | |
| 2012/0064712 A1 | 3/2012 | Lei et al. | |
| 2012/0129335 A1 | 5/2012 | Ikumo et al. | |
| 2012/0193793 A1 | 8/2012 | Tsukamoto | |
| 2014/0001615 A1 | 1/2014 | Otremba et al. | |
| 2014/0361431 A1 | 12/2014 | Matsumoto et al. | |
| 2016/0276237 A1 | 9/2016 | Lin et al. | |
| 2016/0300804 A1 | 10/2016 | Omori | |
| 2017/0053872 A1 | 2/2017 | Lee et al. | |
| 2017/0098627 A1 | 4/2017 | Das et al. | |
| 2017/0110398 A1* | 4/2017 | Chang | H01L 23/5226 |
| 2017/0221840 A1 | 8/2017 | Paleari et al. | |

OTHER PUBLICATIONS

U.S. Appl. No. 15/239,545, filed Aug. 17, 2016, Method of Manufacturing Semiconductor Devices and Corresponding Device.

\* cited by examiner

SEMICONDUCTOR DEVICE AND A CORRESPONDING METHOD OF MANUFACTURING SEMICONDUCTOR DEVICES

BACKGROUND

Technical Field

The description relates to semiconductor devices.

One or more embodiments may apply, e.g., to thermo-mechanical stress reduction in integrated circuits, e.g., for automotive and consumer products.

Description of the Related Art

Various types of integrated circuits (ICs) may adopt technologies such as BCD (Bipolar-CMOS-DMOS) technology.

BCD technology may be advantageously used, e.g., for producing integrated circuits with both power electronics and logical control electronics. BCD technology provides a family of silicon processes, each of which combines the strengths of three different process technologies onto a single chip: bipolar for precise analog functions, CMOS (complementary metal oxide semiconductor) for digital design and DMOS (double diffused metal oxide semiconductor) for power and high-voltage elements.

Implementing BCD technology may involve top layer copper metal interconnections, called re-distribution layer (RDL). These are thick metal layers (as opposed to thin metal layers under one micrometer ($1 \times 10^{-6}$ m) of thickness which are suitable for instance to connection through bumping.

However, resistance of passivation and intermediate insulating layers against reliability issues, as caused, e.g., by thermo-elastic coupling and stresses during wire bonding and packaging processes, may represent factors deserving attention.

Silicon nitride (SiN) may be used in manufacturing ICs to provide a passivation layer for microchips, e.g., to provide a barrier against water molecules and other sources of corrosion and instability in microelectronics.

In metallizations such as Cu (copper) RDL top metallizations, stresses may arise due to thermo-mechanical mismatch between different materials, e.g., barrier layer (Ti, TiN, TiW, Ta, TaNta), metallization capping layer (Ni—Pd, Ni—Pd—Au, Ni—Au), passivation layer (SiN). In this regard in FIG. 1A it is shown a semiconductor device in the form of a portion of integrated circuit 50, obtained with BCD (Bipolar-CMOS-DMOS) technology, where with the reference 10 is indicated a dielectric substrate, on which a passivation layer 20 is deposited.

Not represented in FIG. 1A, under the dielectric layer 10, connected through the metal conductive leads 31, is placed active circuitry operatively associated to the portion of integrated circuit 50.

In general, the portion of integrated circuit 50 shown in FIG. 1A corresponds to the dielectric layer of a chip or die, which is connected to active circuitry and can be connected to other chips or die, placed above or under such chip or die, in particular through the re-distribution layers.

The dielectric layer 10 is not continuous, but it is divided in four sub-layers 10a, 10b, 10c, 10d, starting from the bottom. The passivation layer 20 then lies above the uppermost sub-layer 10d.

Conductive formations, or leads, 31 corresponding to connection for the metal conduction tracks are included in the sub-layers 10a, 10b, 10c, 10d, with respective vertical vias connecting one to the other through the sub-layers 10a, 10b, 10c, 10d of the dielectric layer 10. Each of the dielectric sub-layers 10a, 10b, 10c, 10d corresponds to a dielectric layer, incorporating metal routings or silicon polycrystalline structures, for instance sub-layer 10d corresponds to metal 3 level.

With the reference 36 it is thus indicated a metal layer, representing an interconnection metallization, specifically a copper re-distribution layer, or Cu RDL in the following, arranged over a via 22, and covered by a combined capping or coating layer 37. The combined capping layer 37 includes an inner layer 38, which in variant embodiments may be composed by a Ni or a Ni alloy, as for instance NiP, NiPW, NiPMo, and includes an outer layer 40 which in variant embodiments may be composed of materials such as Au, Pd, or Pd/Au. Also, in variant embodiments, the re-distribution layer 36 body can be obtained using other metals such as copper alloys or gold. In the example shown the Cu RDL metal layer, i.e., the body of the copper re-distribution layer without the capping 37, has a thickness t higher than 1 micrometer with respect to the level of the upper face of a passivation layer 20 on which the Cu-RDL 36 lies.

In the description of FIG. 1 and in the following the vertical direction designates the direction along which the layers are deposited one over the other, while the horizontal direction generally designates a direction parallel to the plane of the layers, i.e., the plane of a dielectric layer 10, as better detailed in the following. The dielectric layer 10 is intended as lying on the bottom of the stack of layers shown, while the Cu RDL 36 is on the top.

The via 22, as it is known, is an hole etched through the flat passivation nitride 20 and the dielectric layer 10d reaching a conductive lead 31. The via 22 is covered by a barrier layer 30, which in variant embodiments may be a layer of titanium, tantalum or of one of their alloys such as Ti or Ta, or one of their alloys, which extends horizontally for the entire width of the Cu RDL layer 36.

A triple point TP is indicated in FIG. 1A and in FIG. 1B provides a magnification of the region surrounding such triple point TP. As shown in the magnification of FIG. 1B, therefore there is a point, i.e., the triple point TP, where the metallization capping layer 38 surrounding the RDL Cu layer 36, in particular a foot 37a of the vertical wall of the metallization capping layer 37 covering the vertical wall 36a of the RDL Cu layer 36, meets the barrier layer 30 and the nitride passivation layer 20.

This specifically shows how in standard conditions in structure corners the Cu RDL stresses SiN passivation for thermo-mechanical mismatch between the different materials that are in contact, labeled 30, 38 and 20.

BRIEF SUMMARY

One or more embodiments contribute to overcoming the critical issues mentioned in the foregoing, for instance the Cu RDL stressing SiN passivation for thermo-mechanical mismatch between different materials at the edge of a Cu RDL structure.

According to one or more embodiments, a semiconductor device includes a dielectric layer, a passivation layer over the dielectric layer, a via through the passivation layer and the dielectric layer, an interconnection metallization arranged over the via and having a metallization body and a peripheral portion on the passivation layer, an outer surface coating that coats the interconnection metallization, and a diffusion barrier layer separating the peripheral portion of the interconnection metallization from the passivation layer. The diffusion barrier layer comprises an inner planar portion deposited on the passivation layer and a peripheral portion and has a thickness substantially equal to the inner planar portion. The diffusion barrier layer extends along a plane at a vertical height higher than a surface of the passivation layer on which the inner planar portion of the barrier layer extends, so that the peripheral portion and the inner portion of the diffusion barrier layer form a step in the diffusion barrier layer. The outer surface coating has a vertical wall with a foot that is adjacent to the peripheral portion of the diffusion barrier layer and is positioned at the vertical height over the surface of the passivation layer. The peripheral portion of the diffusion barrier layer and the adjacent foot of the outer surface coating are spaced apart from the surface of the passivation layer by a hollow recess area.

One or more embodiments may also relate to a corresponding manufacturing method.

The claims are an integral part of the technical disclosure of one or more embodiments has provided herein.

One or more embodiments may lead to SiN passivation stress reduction by dispensing with a "triple point", e.g., by decoupling a capping-barrier (interface from a passivation top surface (e.g., SiN).

One or more embodiments may involve a modification of a, e.g., Cu RDL process flow including a formation of a step in the barrier layer portion adjoining the foot of vertical wall of the coating layer and the removal of a sacrificial layer under said step to obtain an hollow recess.

BRIEF DESCRIPTION OF THE SEVERAL VIEWS OF THE FIGURES

One or more embodiments will now be described, purely by way of example, with reference to the annexed figures, in which.

It will be appreciated that for the sake of clarity of representation certain features of the figures (e.g., layer thicknesses) may not be drawn to a same scale.

DETAILED DESCRIPTION

In the ensuing description, one or more specific details are illustrated, aimed at providing an in-depth understanding of examples of embodiments. The embodiments may be obtained without one or more of the specific details, or with other methods, components, materials, etc. In other cases, known structures, materials, or operations are not illustrated or described in detail so that certain aspects of embodiments will not be obscured.

Reference to "an embodiment" or "one embodiment" in the framework of the present description is intended to indicate that a particular configuration, structure, or characteristic described in relation to the embodiment is comprised in at least one embodiment. Hence, phrases such as "in an embodiment" or "in one embodiment" that may be present in one or more points of the present description do not necessarily refer to one and the same embodiment. Moreover, particular conformations, structures, or characteristics may be combined in any adequate way in one or more embodiments.

The references used herein are provided merely for convenience and hence do not define the extent of protection or the scope of the embodiments.

Figure 1:
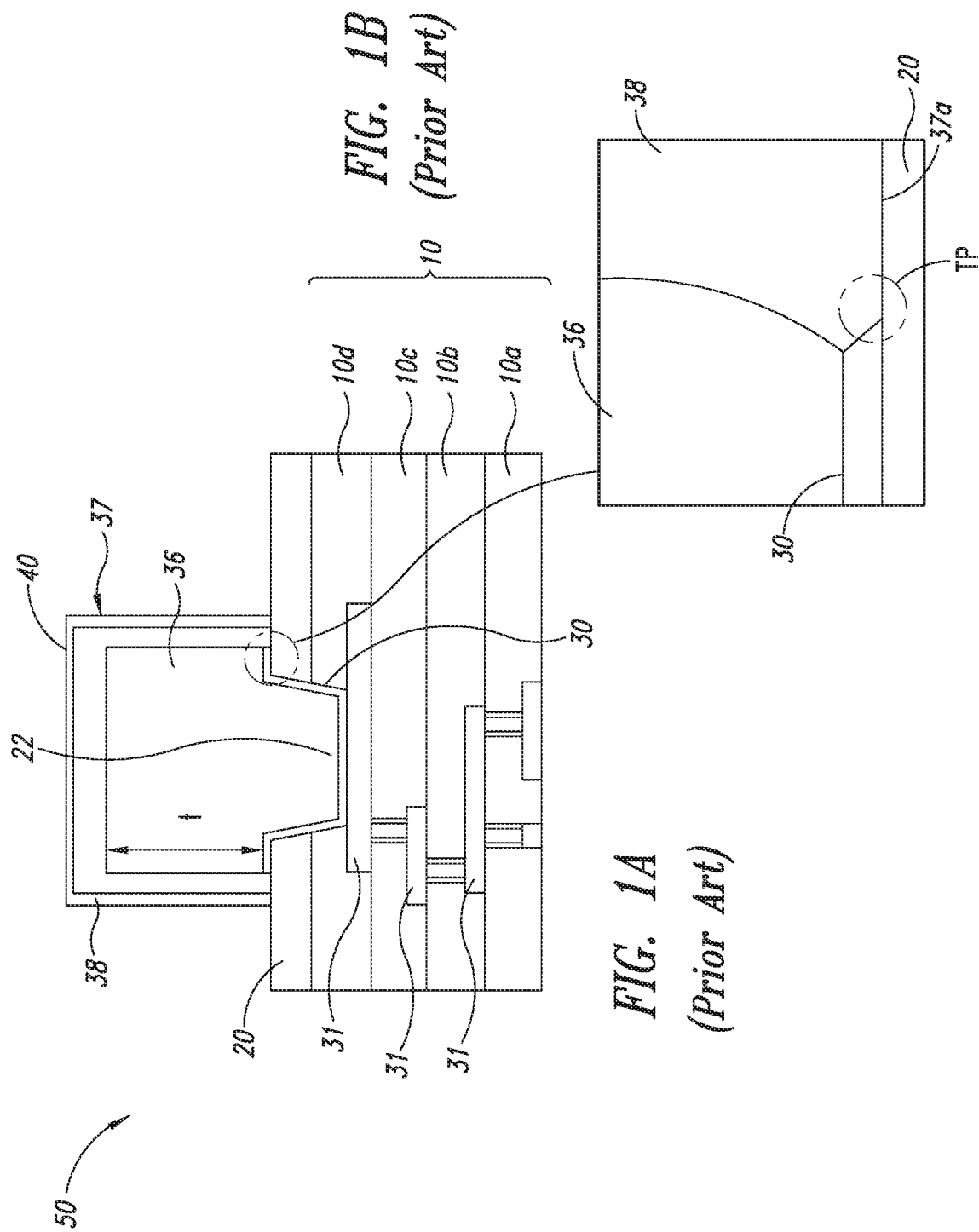
FIGS. 1A and 1B have been already described in the foregoing.
Figure 2:
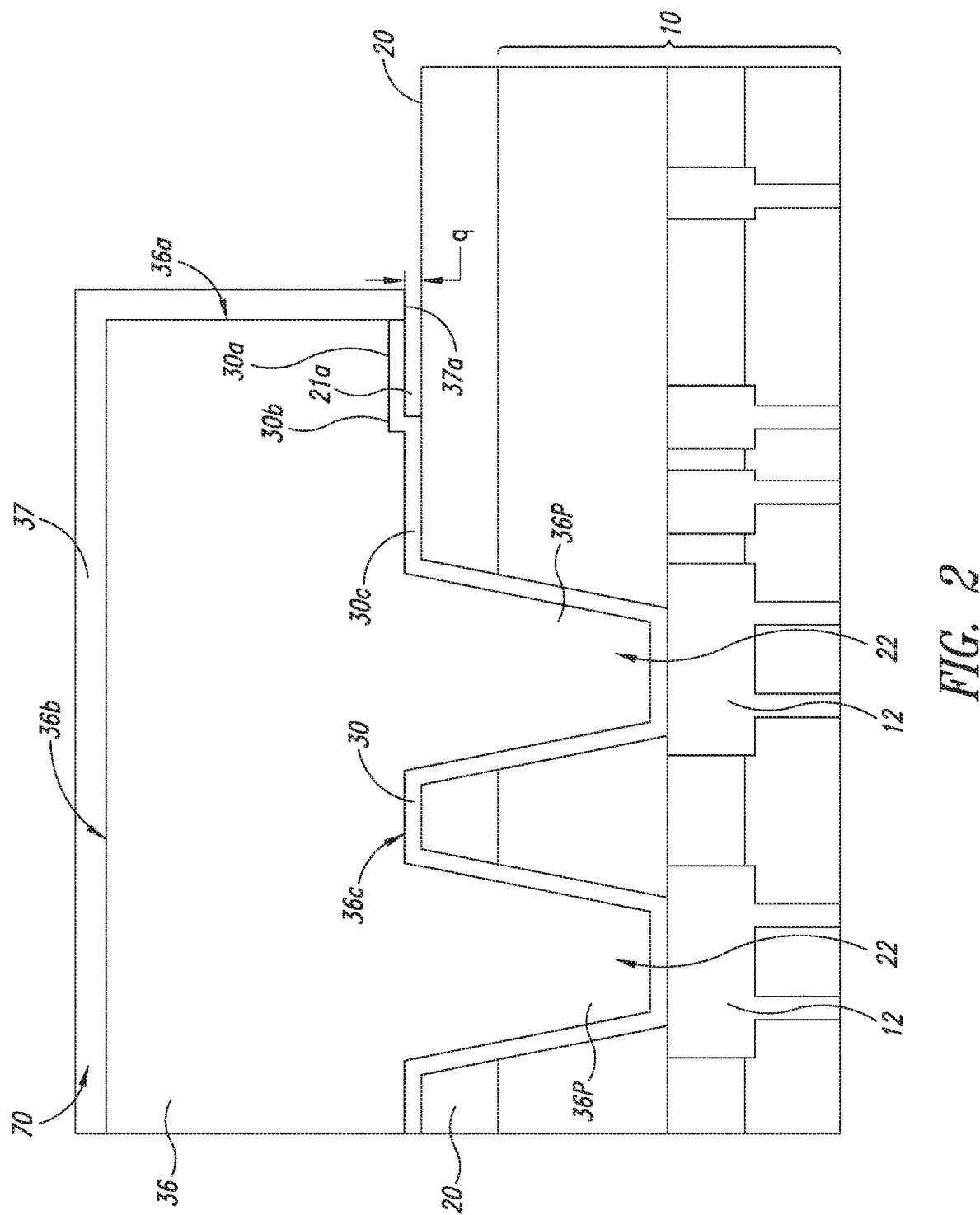
FIG. 2 represents an embodiment of the semiconductor device here described.

In FIG. 2 it is shown a semiconductor device in the form of a portion of integrated circuit 70 according to the solution here described. Equal numbers indicates elements having a function analogous to the one with the same reference number in FIGS. 1A and 1B.

Such a portion of integrated circuit 70, like the portion of integrated circuit 50 of FIGS. 1A and 1B, includes an interconnection metallization 36, which corresponds to a Cu redistribution layer, on a passivation layer 20 over a dielectric layer 10, where two vias 22 passes through such passivation layer 20 and part of the dielectric layer 10, in order to provide respective contacts. Although two vias 22 are shown in FIG. 2, one could employ any number of vias 22 or no vias according to the present disclosure. The interconnection metallization 36, is arranged over such via 22 to provide a top metallization level over the portion of integrated circuit 70. The passivation layer 20, as in FIGS. 1A and 1B, underlies peripheral portions of the Cu redistribution layer 36, in particular of its copper metallization body. Such peripheral portions corresponds for instance to the portions at the corner formed by the flat area of a lower face 36c and the lateral wall 36a of the copper RDL 36. The passivation layer 20 is separated from said peripheral portion of such Cu redistribution layer 36 by the barrier layer 30, which in variant embodiments could be Ti, or Ta, or one of their alloys, such as TiN, the indicated TiW and TaNTa, and it is a layer which extends under the area of the lower face 36c of the Cu redistribution layer 36, interposing between the portion of passivation layer 20 facing the Cu redistribution layer 36 and also covering the via 22. As shown in FIG. 2, the Cu redistribution layer 36 is substantially a conductive track having a parallelepiped shaped body including a top face 36b, which is substantially a horizontal plane facing upwards; the lower face 36c which is a horizontal plane facing the passivation layer 20; protrusions 36p extending downward through the level of the passivation layer 20 and filling the vias 22; and lateral walls 36a. In FIG. 2 only one of said lateral walls is visible, which are substantially vertical walls. It has to be said that the Cu RDL layer 36 can have also different shapes, but it is in general possible to identify a top surface for the contact, for instance by another chip disposed above through a solder bump, a bottom surface, part of which contact the passivation layer and part of which fills the via, and at least one lateral surface.

In the dielectric layer 10 are present electrically conductive (e.g., copper, or, alternatively, an AlCu alloy) formations 12, which operates as connections for the metal conduction tracks within the dielectric layer and towards the active circuitry of the semiconductor device.

The portion of integrated circuit 70 shown in FIG. 2 presents an interposed diffusion barrier layer 30 which includes a peripheral portion 30a, adjacent to the foot 37a of the vertical wall of the outer surface coating 37, and an inner planar portion 38c which have substantially the same thickness. The peripheral portion 30a and extends along a plane which is positioned at a height q higher than the upper surface of the passivation layer 20 along which the inner planar portion 38c of the barrier layer 30 extends, so that the interface between such portions 30a, 30c forms a step 30b in the barrier layer 30, a step having an height q. At such height q terminates also the foot 37a, i.e., the base, of the vertical wall of said outer surface coating 37 adjacent to such peripheral portion 30a. In the space under the peripheral portion 30a and the foot 37a, which have lower surfaces aligned at the same height q, and over the upper surface of the passivation layer 20, i.e., in the space between a surface defined by said peripheral portion 30a and said adjacent foot 38a of the outer surface coating 38,40 and said passivation layer 20, is defined an hollow recess 21a.

Therefore, the portion of integrated circuit 70 shown in FIG. 2 does not present the triple point TP, i.e., (contact point of layers 30, 37 and 20), since the capping layer 37 is separated by the recess 21a from the passivation layer 20. Such solution allows a significant reduction of the mechanical stress applied by the RDL structure on the underlying dielectric layers.

Thus, in general, the semiconductor device 70 includes:
at least one via 22 through said passivation layer 20 and said dielectric layer 10,
at least one interconnection metallization 36 arranged over said at least one via 22, said passivation layer 20 underlying peripheral portions of said interconnection metallization 36, said at least one interconnection metallization 36 including a metallization body 36, preferably including copper,
an outer surface coating 37 on said metallization body 36, and
the interposed diffusion barrier layer 30 separating said passivation layer 20 from said peripheral portion of said at least one interconnection metallization 36. The interposed diffusion barrier layer 30 comprises the inner planar portion 30c deposited on the surface of said passivation layer 20 and the peripheral portion 30a, having substantially the same thickness and extending along a plane at a vertical height q higher than the height of the surface of the passivation layer 20 at which the inner planar portion 30c of the barrier layer 30 extends, so that said peripheral portion 30a forms with said inner portion 30c the step 30b in said barrier layer 30.

The foot 37a of the vertical wall of said outer surface coating 37, adjacent to said peripheral portion 30a also is positioned at said vertical height q over the surface of the passivation layer 20.

The hollow recess area 21a is defined in the space between a surface defined by said peripheral portion 30a and said adjacent foot 37a of the outer surface coating 37 and the upper surface of said passivation layer 20.

Now the process to manufacture the portion of integrated circuit 70 will be described.

Figure 3:
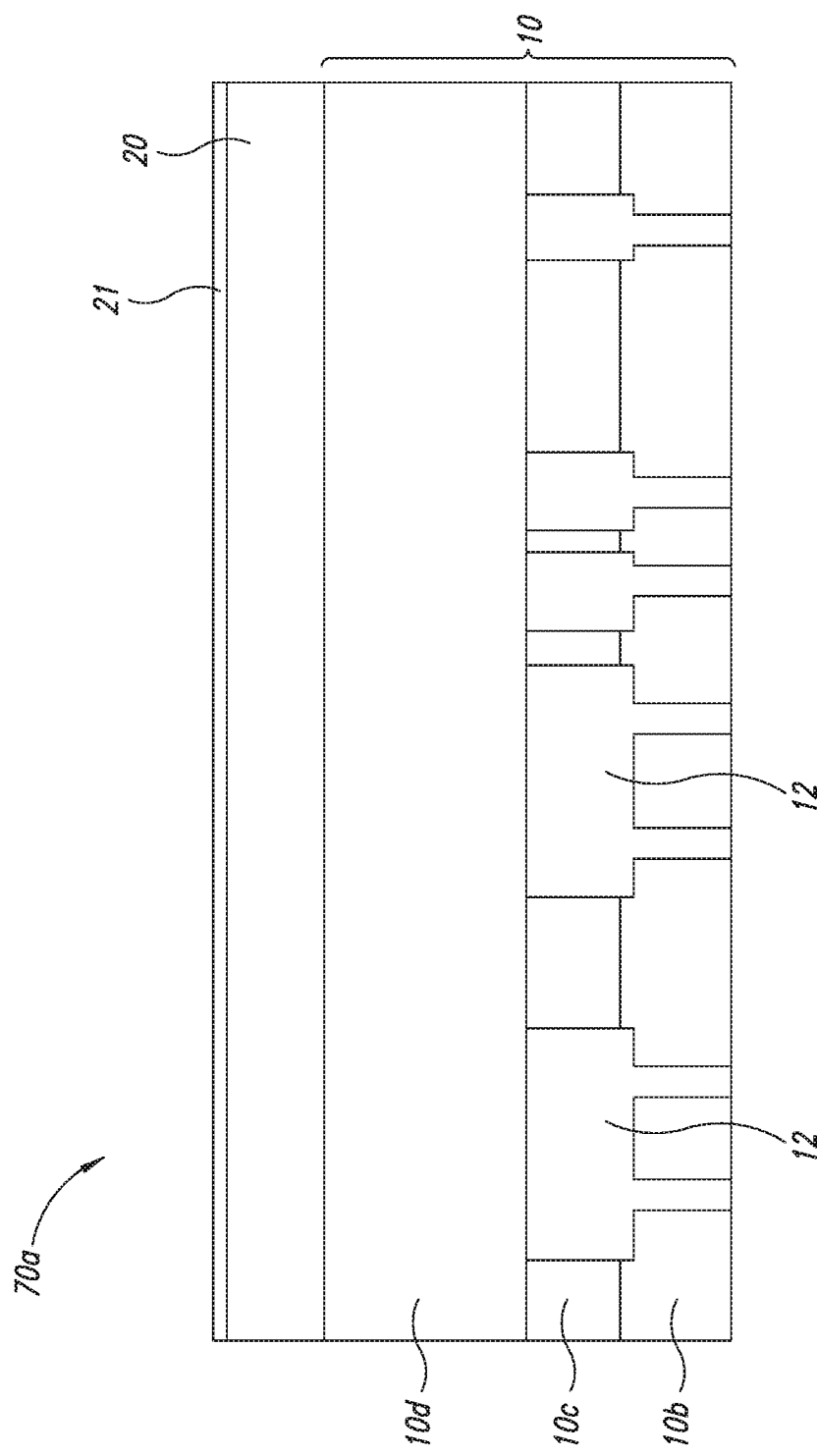
FIGS. 3 to 12 are exemplary of possible steps of one or more embodiments of a manufacturing method of the semiconductor device here described.

In particular, in FIG. 3 is represented a first intermediate structure 70a, including the dielectric layer 10. The passivation layer 20 then lies above the uppermost sub-layer 10d. As mentioned, the intermediate structure 70a can be connected through the conductive portions 12 to active circuitry, as the first intermediate structure 70a is a portion, represented in cross-section, of a semiconductor device which can be for instance a device produced with BCD (bipolar-CMOS-DMOS) technology.

The intermediate structure 70a represents the portion of a chip that will lie immediately underneath the Cu RDL top metallization and obtained by standard process flow for BCD platforms, where layers 10d and 20 are normally dielectric materials, respectively made by silicon oxide and silicon nitride, usually reaching a total thickness higher than 1 micron.

Subsequently, a step of deposition of a thin dielectric layer 21, which is used as a sacrificial layer, is performed, with a thickness q of 50 to 500 nm. In general the thickness q is in any case under a micrometer. The thin dielectric layer 21 is preferably a low thermal silicon nitride layer (LTN) deposited by CVD (chemical vapor deposition) or a thin silicon oxide layer.

It is important that the dielectric sacrificial layer 21 has different resistance to wet and or dry etching processes with respect to the SiN passivation layer 20 in order to be subsequently removed with an adequate selectivity.

Figure 4:
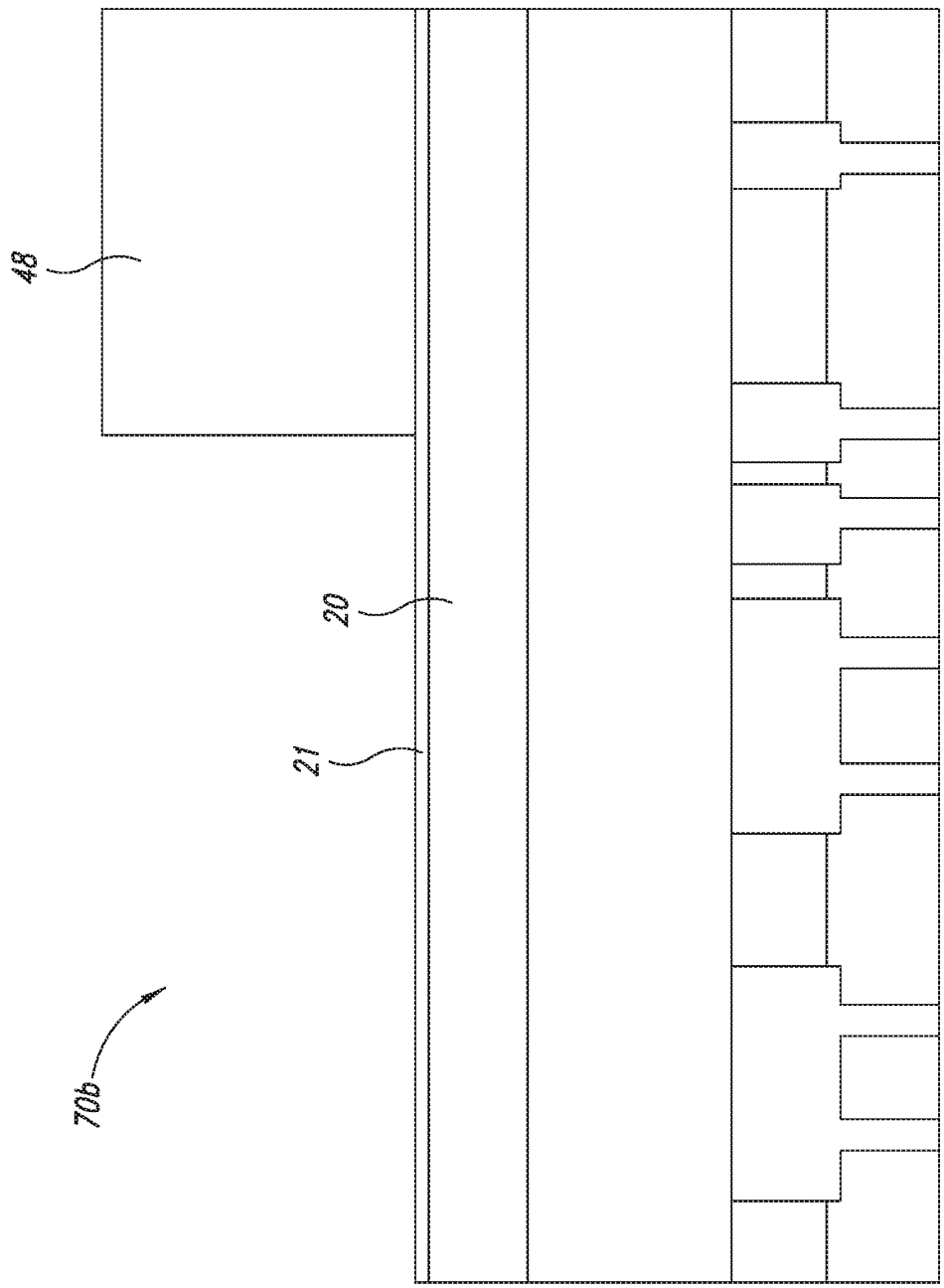

In FIG. 4 is represented a second intermediate structure 70b, obtained from the first intermediate structure 70a by depositing a lithographic mask 48.

Figure 5:
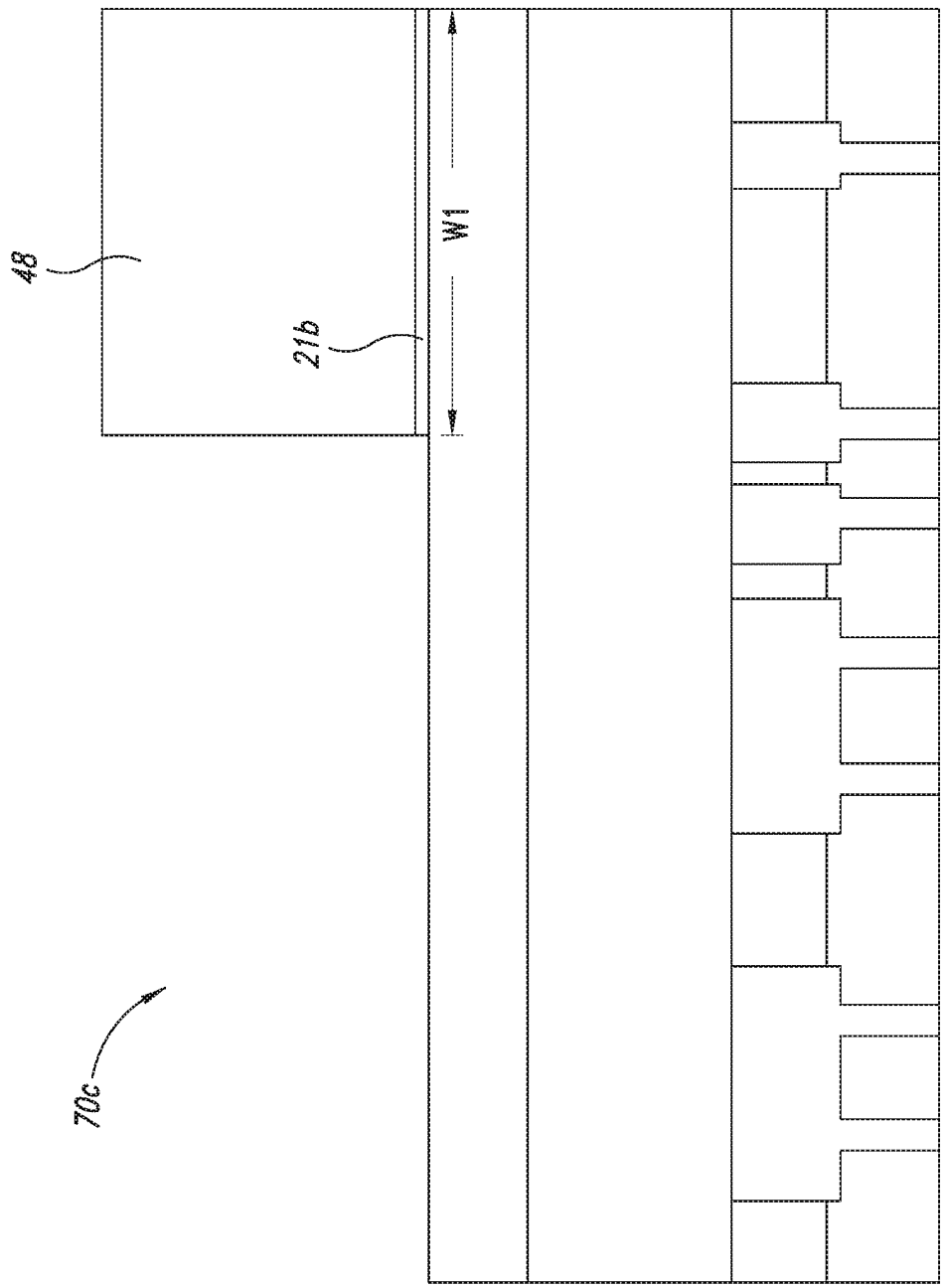

In FIG. 5 it is indicated a width W1 of the lithographic mask 48 in the horizontal direction. In general the following refers to only the width in the horizontal direction, since the device 70 is represented in all the Figure in a vertical cross-section. Of course the mask 48 has also a dimension in the direction perpendicular to the plane of the horizontal and vertical directions.

In FIG. 5 it is represented a third intermediate structure 70c obtained from the second intermediate structure 70b by performing a wet or dry etching in the area not covered by the lithographic mask 48, there removing uncovered portions of the thin dielectric layer 21. It is important to be as much as possible selective to the passivation layer 20 or, alternately, to take into account the effective passivation consumption to be considered during the initial previous deposition of the passivation layer 20 (initial thickness retarget). This leaves the lithographic mask 48 and the region 21b of thin dielectric layer 21 under the lithographic mask 48

Figure 6:
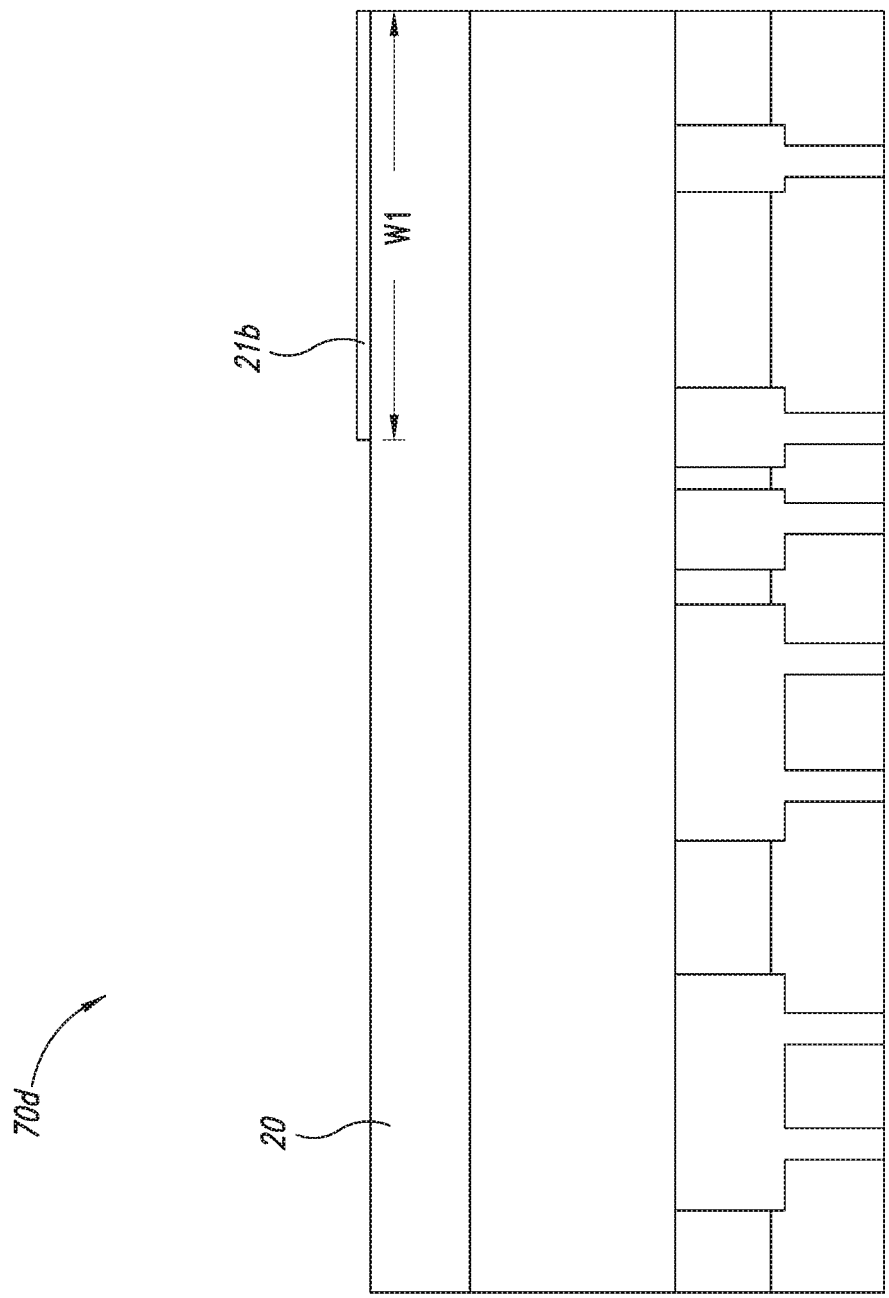

In FIG. 6 is represented a fourth intermediate structure 70d obtained from the third intermediate structure 70c by performing a stripping of the resist forming the lithographic mask 48, leaving the region 21b exposed and having a width W1.

Figure 7:
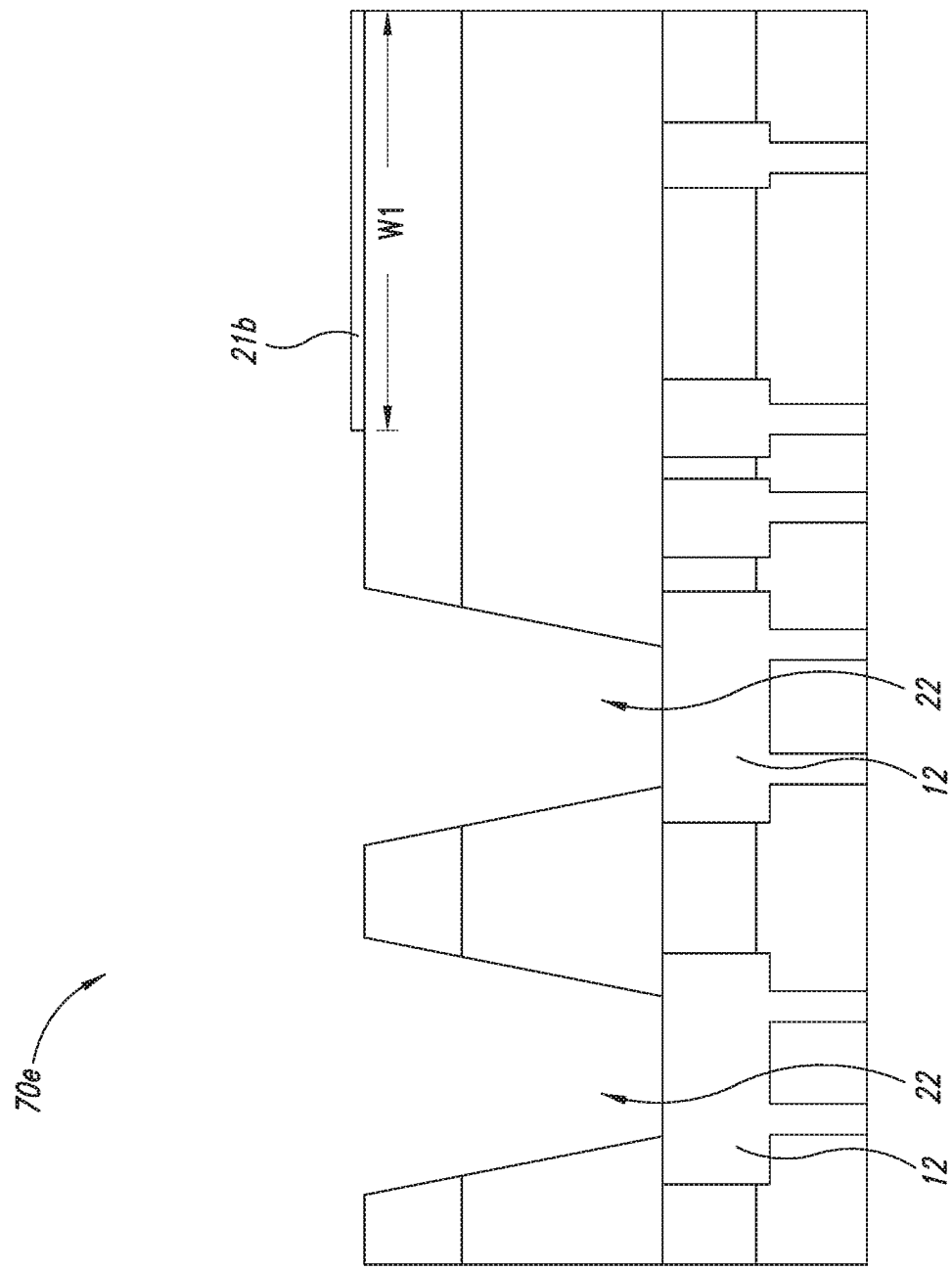
Figure 8:
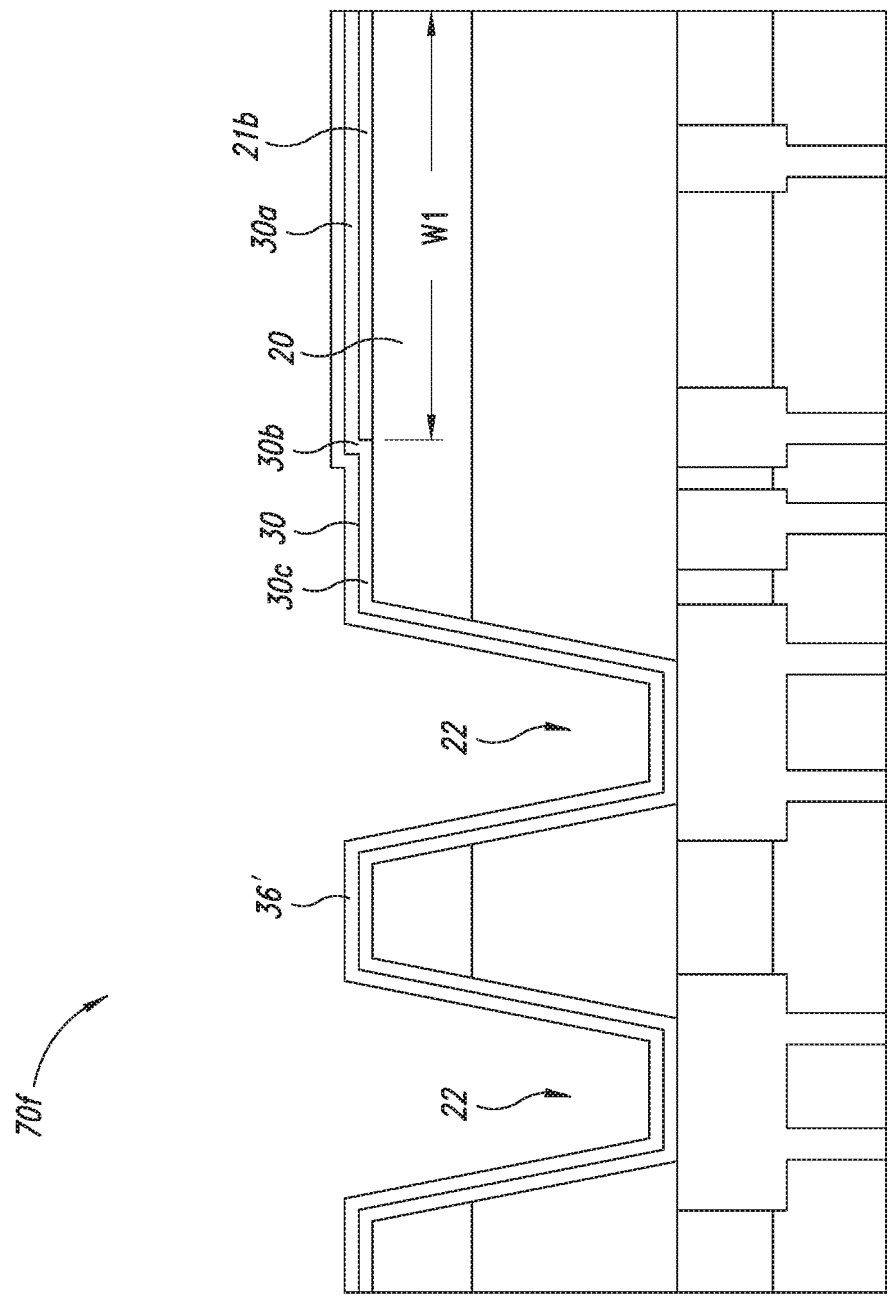

In FIG. 7 is represented a fifth intermediate structure 70e, obtained from the fourth intermediate structure 70c by etching vias 22 through the thin dielectric layer 21, in particular by another masking step not described here, the vias 22 are defined through the passivation layer 20 and the inter-layer dielectric layer 10d, exposing the conductive formations 12 (e.g., copper or AlCu), As shown in FIG. 8, then a sixth intermediate structure 70f is obtained by deposition of a barrier layer 30 and a Cu seed layer 36', also this corresponding to a standard Cu RDL manufacturing flow.

The barrier layer 30 is also deposited over the free surface of the passivation layer 20 and over the region 21b of thin dielectric layer, thereby forming the peripheral portion 30A of the barrier layer at an height q, corresponding to the thickness of the layer 21b, with respect to the surface of the passivation layer 20. Consequently the step 30b is formed in the barrier layer 30, with the peripheral portion 30a of the barrier layer 30 laying over the region 21b of thin dielectric layer which is more elevated, i.e., at height q, while the inner planar region 30c of the barrier layer 30, resting over the open surface of the passivation layer 20, nearer to the center of the RDL metallization 36, extends along a plane at a lower height, i.e., the height of the upper surface of the passivation layer 20.

Figure 9:
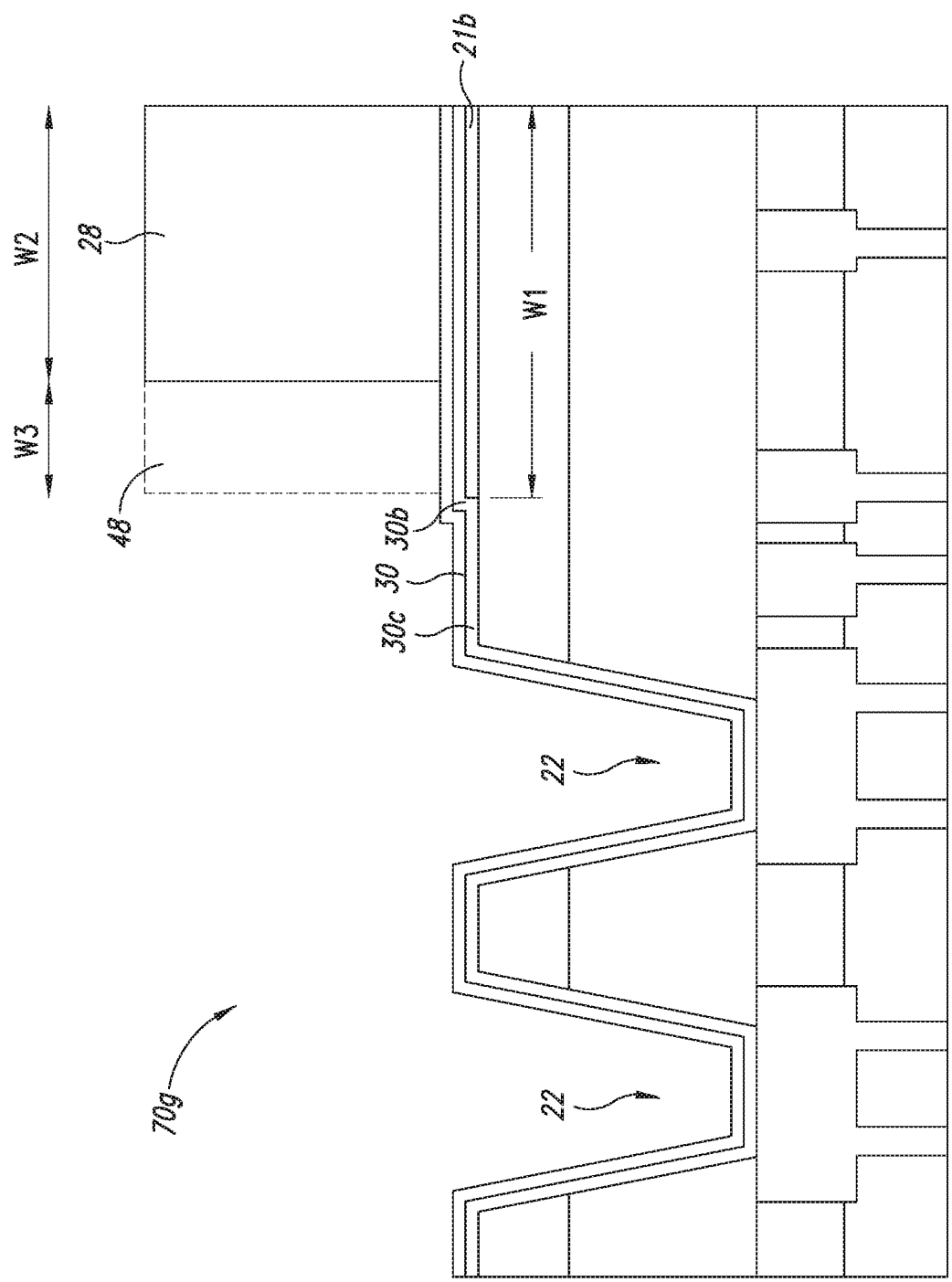

In FIG. 9, it is represented a seventh intermediate structure 70g, obtained from the sixth intermediate structure 70f, with the provision of a dielectric-RDL mask 28, having a horizontal width W2 over the seed layer 36', which leaves uncovered the area around the vias 22, which are to be covered with the body of the Cu RDL layer 36, specifically an area corresponding to the area of the bottom face 36c. It is underlined that as dielectric-RDL mask 28 usually is used the standard mask for the RDL process, with the same horizontal dimension.

In FIG. 9 it is also indicate in dashed line the lithographic mask 48 previously applied and removed to appreciate that such lithographic mask 48 has a greater critical dimension W1 with respect to the critical dimension W2 of the interconnection metallization, i.e., CuRDL, mask 28 for defining the area of the interconnection metallization 36. One can see that such lithographic mask 48 covered also peripheral portion W3 of the area for to the interconnection metallization 36. In other words, the width W2 of mask 28 is smaller than the width W1 of mask 48, this meaning that a portion of the seed layer 36' over the region 21b, which is also of width W1 is left uncovered by the dielectric-RDL mask 28.

Figure 10:
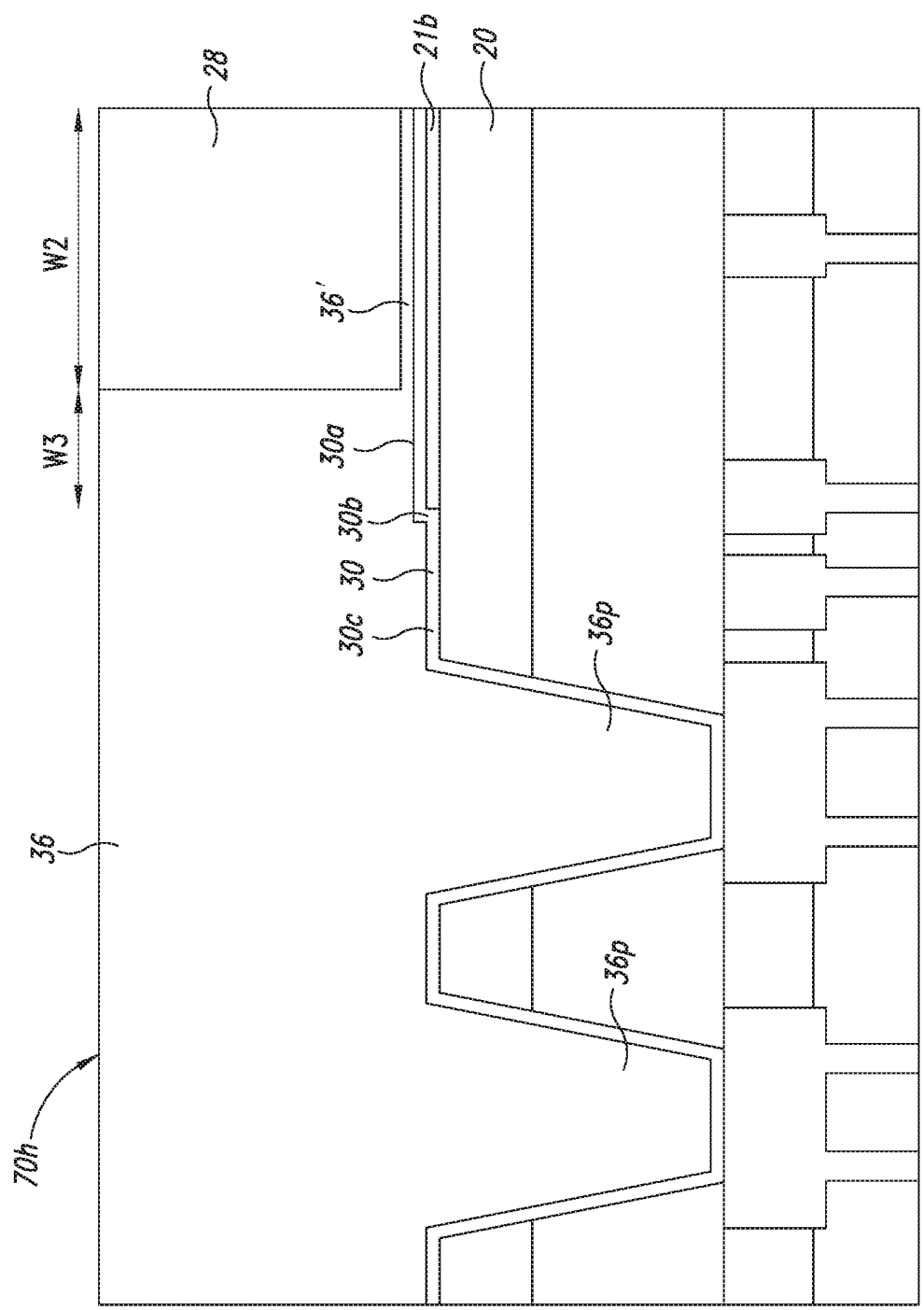

Subsequently, in FIG. 10 an operation of electrochemical copper growth is performed, obtaining an eighth intermediate structure 70h, forming the metal layer 36, e.g., Cu RDL over the vias 22 and over the step 30b of the barrier layer 30. The copper growth also forms the copper protrusions 36p of the metal layer 36 in the vias 22.

Figure 11:
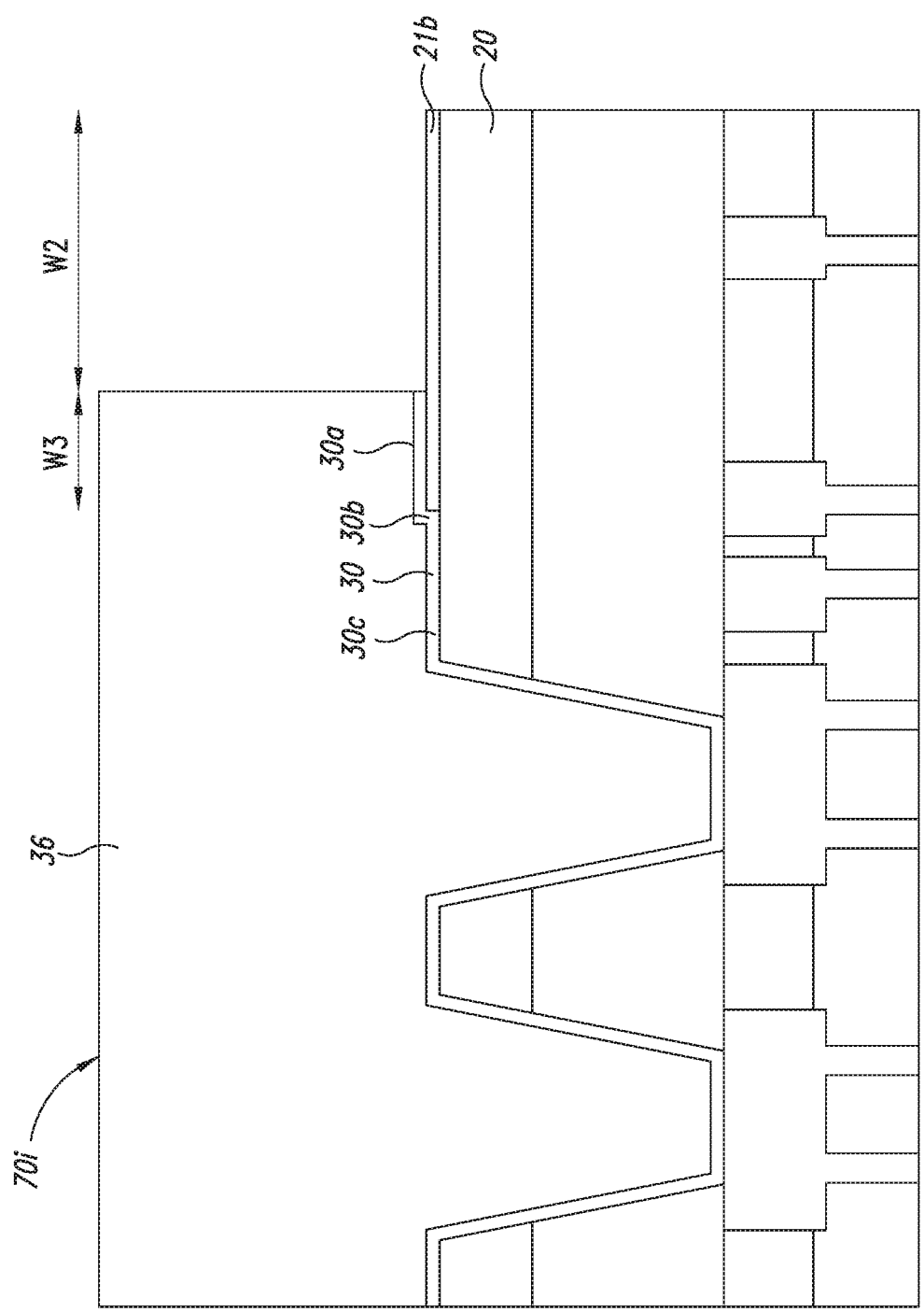

In FIG. 11, it is represented a ninth intermediate structure 70i, obtained from the eighth intermediate structure 70h by removing ("stripping") the dielectric-RDL mask 28 and portions of the Cu "seed" layer 36' and the diffusion barrier 30 that were under the mask 28. In one or more embodiments, the removal of the previously covered portions of the Cu "seed" layer 36' (e.g., via a wet etch process) and the diffusion barrier 30 maintain the thin dielectric layer portion 21b.

Figure 12:
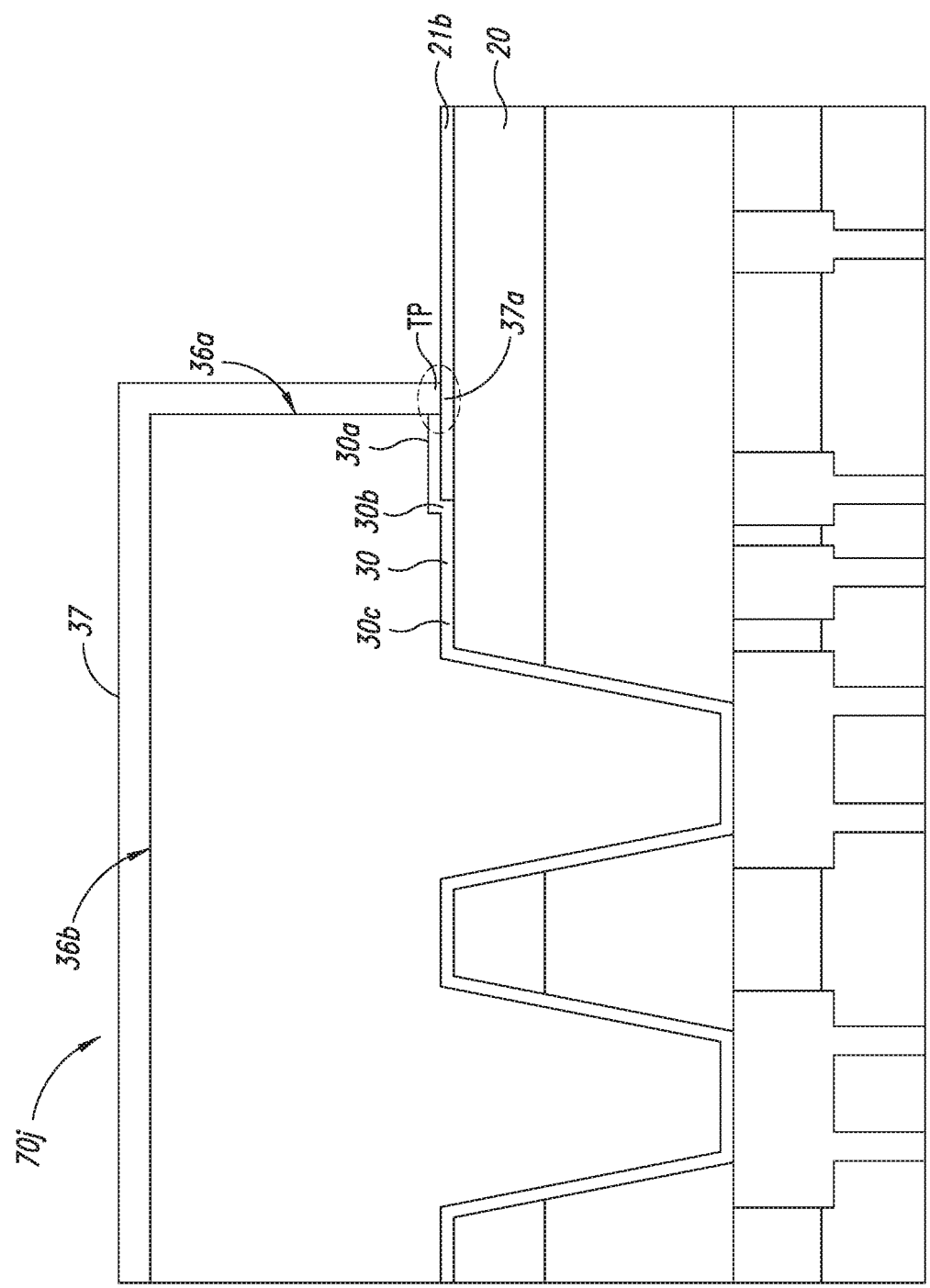

Then FIG. 12 shows a tenth intermediate structure 70j, obtained from the ninth intermediate structure 70i by performing the electroless deposition of the capping layer 37 on the metallization 36.

The procedure to deposit the capping layer 37 to obtain the tenth intermediate structure 70j includes, for instance, a pre-treatment to prepare the copper surface for the subsequent electroless deposition. Then a step of electroless deposition is performed to obtain the inner capping layer 38, which is usually composed by Ni or one of its alloys, such as NiP, NiPW, NiPMo. Subsequently a second step of electroless deposition is in general required, in order to obtain the outer layer 40, usually composed by a noble metal or a combination of noble metals, as for instance palladium or palladium and gold.

On the tenth intermediate structure 70j of FIG. 12 is then performed a further process step of selective wet etch removal of the thin dielectric layer portion 21b. The wet etch operation has to be selective enough to etch only the thin layer 21b without any effect on the metal layers 38, 40 of the capping layer 37 and the passivation layer 20. This can be obtained for instance by dilute HF chemistry. Preferably, the etch rate on the layer 21b should be kept higher than the etching rate on the layer 20 to a point to avoid undercut formation. The wet etch process is self-aligned and for this reason very robust and repeatable: the undercut below the diffusion barrier 30 is auto-limiting by construction; it means that, if an etch time is tuned, the thin layer 21b is completely removed in every area because wet etch automatically ends where the diffusion barrier 30 border starts. In this option the process control depends only on the lithographic process, i.e., control of the width of the mask 48, and not on the wet etch process (etch rate/uniformity control). For this reason, with this solution the process robustness is intrinsically better than the case without a new lithographic mask 48.

A possible target of recess, that is defined by the difference of widths between the masks 28 and 48, could be ~0.5-1.5 um (from the beginning of barrier layer 30).

At the end of such a procedure the portion of integrated circuit 70 of FIG. 2 is obtained.

Again, it will be appreciated that a direct consequence of the last step is the elimination of the "triple point" TP (contact point of layers 30, 38 and 20) which is the area with the highest mechanical stress during high thermal budgets.

It will be otherwise appreciated that the specific choices of material as exemplified in the foregoing are primarily related to certain process embodiments, e.g., in connections with the re-distribution layer process flow. In one or more embodiments, different implementation options may dictate, e.g., different choices of materials and/or layer thicknesses.

In variant embodiments, during the deposition of the barrier layer 30 it can be obtained a single layer with a different type of barriers or the barriers can be adjusted as multilayer, for instance a multilayer including layers of TiW with a different Ti ratio. The multilayer in variant embodiments can contains layers of TiW, TiN, Ti, Ta, TaNTa, also combinations of these different materials. The single layer can have a thickness in the range 40-4000 A.

One or more embodiments may thus provide a method of manufacturing semiconductor devices such as device 70 including:

defining the dielectric substrate 10 and the passivation layer 20;

depositing a thin sacrificial dielectric layer 21, in particular under a micrometer of vertical height or thickness q;

performing an etching of the thin sacrificial dielectric layer 21 using a lithographic mask 48 with a greater width W1 with respect to the width W2 of a interconnection metallization, in particular copper re-distribution layer, mask 28 for defining the area of the interconnection metallization 36 so that such lithographic mask 48 covers a peripheral portion W3 of the area for to the interconnection metallization 36, defining vias 22 through at least the dielectric layer passivation layer 20 and said dielectric substrate 10, depositing said barrier layer 30 over said passivation layer 20, growing the metallization 36, said operation of growing including a metal, in particular copper, seed deposition step and a metallization growth step, in particular by electrochemical deposition (ECD), followed by a removal of the portions of the metal seed deposition 36' and of the barrier layer 30 over the passivation layer 20 that were covered by the mask 28, depositing the outer coating layer 37 to enclose the metallization 36, and performing a selective wet etch of the dielectric layer portion 21b to form said hollow recess 21a.

One or more embodiments may provide a device wherein the hollow recess area 21 has a vertical height q under a micrometer.

One or more embodiments may provide a device wherein the interconnection metallization 36 is a copper Re-Distribution Layer.

One or more embodiments may provide a device wherein said passivation material of the layer 20 is silicon nitride.

One or more embodiments may provide a device wherein said at least an interconnection metallization 36 on a passivation layer 20 over a dielectric layer 10 is included in an integrated circuit or chip or die, in particular obtained by a BCD (Bipolar-CMOS-DMOS) technology.

Thermo-mechanical simulations highlights no critical tensile stress in passivation for both configurations.

Without prejudice to the underlying principles, the details and embodiments may vary, even significantly, with respect to what has been disclosed merely by way of example, without departing from the extent of protection.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A semiconductor device comprising:
a dielectric layer;
a passivation layer over the dielectric layer;
a via through said passivation layer and said dielectric layer;
an interconnection metallization arranged over said via and having a metallization body and a peripheral portion on the passivation layer;
an outer surface coating that coats said metallization body; and
a diffusion barrier layer, separating the peripheral portion of the interconnection metallization from the passivation layer, said diffusion barrier layer comprises an inner planar portion deposited on the passivation layer and a peripheral portion, having a thickness substantially equal to the inner planar portion and extending along a plane at a vertical height higher than a surface of the passivation layer on which the inner planar portion of the barrier layer extends, so that said peripheral portion of the diffusion barrier layer forms with said inner portion a step in said diffusion barrier layer, wherein:
said outer surface coating has a vertical wall with a foot that is adjacent to said peripheral portion of the diffusion barrier layer and is positioned at said vertical height over the surface of the passivation layer; and
said peripheral portion of the diffusion barrier layer and said adjacent foot of the outer surface coating are spaced apart from the surface of said passivation layer by a hollow recess area.

2. The device of claim 1, wherein said hollow recess area has a vertical height under a micrometer.

3. The device of claim 1, wherein said interconnection metallization is a copper re-distribution layer.

4. The device of claim 1, wherein said passivation layer is silicon nitride.

5. The device of claim 1, wherein said interconnection metallization is included in a BCD (bipolar-CMOS-DMOS) integrated circuit on a chip.

6. The device of claim 1, wherein said interconnection metallization includes copper.

7. The device of claim 1, wherein said outer surface coating includes a nickel or nickel alloy layer and a noble metal layer.

8. The device of claim 1, wherein said diffusion barrier layer is a titanium or titanium alloy barrier layer.

9. A device comprising:
a passivation layer;
an interconnection metallization having a peripheral portion on the passivation layer;
an outer surface coating that coats said interconnection metallization; and
a diffusion barrier layer separating the peripheral portion of the interconnection metallization from the passivation layer, said diffusion barrier layer including an inner planar portion deposited on the passivation layer and a peripheral portion, having a thickness substantially equal to the inner planar portion and extending along a plane at a vertical height higher than a surface of the passivation layer on which the inner planar portion of the barrier layer extends, so that said peripheral portion of the diffusion barrier layer forms with said inner portion a step in said diffusion barrier layer, wherein:
the outer surface coating includes a lateral wall having a foot that is adjacent to said peripheral portion and is positioned at said vertical height over the surface of the passivation layer; and
said peripheral portion and said adjacent foot of the outer surface coating are spaced apart from the surface of said passivation layer by a hollow recess area.

10. The device of claim 9, wherein said hollow recess area has a vertical height under a micrometer.

11. The device of claim 9, wherein said interconnection metallization is a copper re-distribution layer.

12. The device of claim 9, further comprising a dielectric layer under the passivation layer.

13. The device of claim 9, further comprising a via that extends through the passivation layer, wherein the interconnection metallization includes a protrusion extending into the via.

14. The device of claim 13, wherein the diffusion barrier layer covers a side surface of the passivation layer that defines a sidewall of the via and is positioned in the via between the interconnection metallization and the side surface of the passivation layer.

15. The device of claim 9, wherein said outer surface coating includes a nickel or nickel alloy layer and a noble metal layer.

16. A semiconductor device comprising:
a passivation layer;
a via through said passivation layer;
an interconnection metallization arranged over and in the via and having a metallization body and a peripheral portion directly above the passivation layer;
an outer surface coating that coats said metallization body; and
a diffusion barrier layer, separating the peripheral portion of the interconnection metallization from a surface of the passivation layer, said diffusion barrier layer comprises an inner planar portion deposited on the passivation layer and a peripheral portion, having a thickness substantially equal to the inner planar portion and extending at a vertical height higher than the surface of the passivation layer, wherein:
said outer surface coating has a vertical wall with a foot that contacts said peripheral portion of the diffusion barrier layer and is positioned at said vertical height over the surface of the passivation layer; and
said peripheral portion of the diffusion barrier layer and said adjacent foot of the outer surface coating are spaced apart from the surface of said passivation layer by a hollow recess area.

17. The device of claim 16, wherein said hollow recess area has a vertical height under a micrometer.

18. The device of claim 16, wherein said interconnection metallization is a copper re-distribution layer.

19. The device of claim 16, further comprising a dielectric layer under the passivation layer, wherein the via extends through the dielectric layer and the diffusion barrier layer coats portions of the passivation layer and dielectric layer that define walls of the via.

20. The device of claim 16, wherein said interconnection metallization is included in a BCD (bipolar-CMOS-DMOS) integrated circuit on a chip.

21. The device of claim 16, wherein said diffusion barrier layer is a titanium or titanium alloy barrier layer.

* * * * *